(12) United States Patent
Lau et al.

(10) Patent No.: US 11,807,931 B2
(45) Date of Patent: *Nov. 7, 2023

(54) CHAMBER INJECTOR

(71) Applicant: Applied Materials, Inc., Santa Clara, CA (US)

(72) Inventors: Shu-Kwan Lau, Sunnyvale, CA (US); Lit Ping Lam, Singapore (SG); Preetham Rao, Santa Clara, CA (US); Kartik Shah, Saratoga, CA (US); Ian Ong, Singapore (SG); Nyi O. Myo, San Jose, CA (US); Brian H. Burrows, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/961,040

(22) Filed: Oct. 6, 2022

(65) Prior Publication Data

US 2023/0027683 A1 Jan. 26, 2023

Related U.S. Application Data

(63) Continuation of application No. 16/539,317, filed on Aug. 13, 2019, now Pat. No. 11,492,704.
(Continued)

(30) Foreign Application Priority Data

Aug. 29, 2018 (IN) .............................. 201841032311

(51) Int. Cl.
*C23C 16/40* (2006.01)
*C23C 16/455* (2006.01)
(Continued)

(52) U.S. Cl.
CPC .... *C23C 16/45572* (2013.01); *C23C 16/4583* (2013.01); *C23C 16/46* (2013.01)

(58) Field of Classification Search
CPC .......... C23C 16/45572; C23C 16/4583; C23C 16/46; C23C 16/4551; C23C 16/481; C23C 16/45504
(Continued)

(56) References Cited

U.S. PATENT DOCUMENTS 5,104,592 A  4/1992  Hull et al.
5,108,792 A  4/1992  Anderson et al.
(Continued)

FOREIGN PATENT DOCUMENTS

JP  2015534283 A  11/2015
KR  20130127400  11/2013
(Continued)

OTHER PUBLICATIONS

International Search Report dated Dec. 2, 2019 for Application PCT/US2019/046236.
(Continued)

*Primary Examiner* — Rudy Zervigon
(74) *Attorney, Agent, or Firm* — Patterson + Sheridan, LLP

(57) ABSTRACT

Embodiments described herein generally relate to apparatus for fabricating semiconductor devices. A gas injection apparatus is coupled to a first gas source and a second gas source. Gases from the first gas source and second gas source may remain separated until the gases enter a process volume in a process chamber. A coolant is flowed through a channel in the gas injection apparatus to cool the first gas and the second gas in the gas injection apparatus. The coolant functions to prevent thermal decomposition of the gases by mitigating the influence of thermal radiation from the pro-
(Continued)

cess chamber. In one embodiment, the channel surrounds a first conduit with the first gas and a second conduit with the second gas.

20 Claims, 8 Drawing Sheets

Related U.S. Application Data

(60) Provisional application No. 62/750,376, filed on Oct. 25, 2018.

(51) Int. Cl.
  *C23C 16/46* (2006.01)
  *C23C 16/458* (2006.01)

(58) Field of Classification Search
  USPC .................. 118/715; 156/345.33, 345.34
  See application file for complete search history.

(56) References Cited

U.S. PATENT DOCUMENTS

| | | | |
|---|---|---|---|
| 5,551,982 A | 9/1996 | Anderson et al. | |
| 5,592,581 A | 1/1997 | Okase | |
| 5,884,009 A | 3/1999 | Okase et al. | |
| 5,914,050 A | 6/1999 | Comita et al. | |
| 6,036,482 A | 3/2000 | Okase | |
| 6,630,030 B1 | 10/2003 | Suntola et al. | |
| 6,716,289 B1 | 4/2004 | Sillmon et al. | |
| 9,267,205 B1 | 2/2016 | Ishikawa et al. | |
| 2001/0018319 A1 | 8/2001 | Czech | |
| 2002/0017244 A1 | 2/2002 | Sillmon et al. | |
| 2002/0028633 A1 | 3/2002 | Walch | |
| 2002/0173164 A1 | 11/2002 | Raffin et al. | |
| 2002/0179586 A1 | 12/2002 | Wengert et al. | |
| 2003/0092266 A1 | 5/2003 | Anderson et al. | |
| 2003/0119283 A1 | 6/2003 | Ishibashi et al. | |
| 2004/0016647 A1 | 1/2004 | Yang et al. | |
| 2004/0050326 A1 | 3/2004 | Thilderkvist et al. | |
| 2004/0099378 A1 | 5/2004 | Kim et al. | |
| 2004/0266320 A1 | 12/2004 | Walch | |
| 2005/0063448 A1 | 3/2005 | Kusuda | |
| 2005/0189073 A1 | 9/2005 | Sandhu | |
| 2006/0113038 A1 | 6/2006 | Gondhalekar et al. | |
| 2006/0137820 A1 | 6/2006 | Lee et al. | |
| 2006/0156979 A1 | 7/2006 | Thakur et al. | |
| 2007/0170148 A1 | 7/2007 | Kuppurao et al. | |
| 2008/0017099 A1 | 1/2008 | Onomura et al. | |
| 2008/0236495 A1 | 10/2008 | Tompa | |
| 2008/0296351 A1 | 12/2008 | Crockett et al. | |
| 2010/0044903 A1 | 2/2010 | Rhoades et al. | |
| 2010/0143588 A1 | 6/2010 | Belousov et al. | |
| 2012/0031330 A1 | 2/2012 | Tsumori et al. | |
| 2012/0048180 A1 | 3/2012 | Ito et al. | |
| 2012/0111271 A1 | 5/2012 | Begarey et al. | |
| 2012/0240853 A1 | 9/2012 | Carlson et al. | |
| 2012/0244684 A1 | 9/2012 | Suzuki et al. | |
| 2012/0258259 A1 | 10/2012 | Bansal et al. | |
| 2012/0266819 A1 | 10/2012 | Sanchez et al. | |
| 2012/0270384 A1* | 10/2012 | Sanchez .............. | C23C 16/4584 118/725 |
| 2012/0325138 A1 | 12/2012 | Suzuki et al. | |
| 2013/0019803 A1 | 1/2013 | Samir et al. | |
| 2013/0036968 A1 | 2/2013 | Suzuki et al. | |
| 2013/0084390 A1 | 4/2013 | Suzuki et al. | |
| 2013/0084391 A1 | 4/2013 | Lee et al. | |
| 2013/0109159 A1 | 5/2013 | Carlson | |
| 2013/0125819 A1 | 5/2013 | Borean et al. | |
| 2013/0152853 A1 | 6/2013 | Suzuki et al. | |
| 2013/0220222 A1 | 8/2013 | Huang et al. | |
| 2013/0247816 A1 | 9/2013 | Suzuki et al. | |
| 2013/0299009 A1 | 11/2013 | Jiang et al. | |
| 2013/0313123 A1 | 11/2013 | Abraham et al. | |
| 2014/0026816 A1 | 1/2014 | Myo et al. | |
| 2014/0113084 A1 | 4/2014 | Nguyen et al. | |
| 2014/0137801 A1* | 5/2014 | Lau ................... | C30B 25/14 118/728 |
| 2014/0199056 A1 | 7/2014 | Chang et al. | |
| 2014/0261185 A1 | 9/2014 | Aboagye et al. | |
| 2014/0322897 A1 | 10/2014 | Samir et al. | |
| 2015/0096496 A1 | 4/2015 | Suda et al. | |
| 2015/0152991 A1 | 6/2015 | Lin | |
| 2015/0292088 A1 | 10/2015 | Canizares | |
| 2015/0345046 A1 | 12/2015 | Muto et al. | |
| 2015/0361582 A1 | 12/2015 | Luse et al. | |
| 2015/0368796 A1 | 12/2015 | Li et al. | |
| 2015/0368830 A1* | 12/2015 | Brillhart ............. | C30B 25/14 118/728 |
| 2016/0194753 A1 | 7/2016 | Muto et al. | |
| 2016/0230276 A1 | 8/2016 | Aboagye et al. | |
| 2016/0265132 A1 | 9/2016 | Graham et al. | |
| 2016/0289830 A1 | 10/2016 | Abedijaberi et al. | |
| 2016/0322206 A1 | 11/2016 | Lv et al. | |
| 2016/0362813 A1* | 12/2016 | Bao .................... | H01J 37/3244 |
| 2017/0011904 A1 | 1/2017 | Cho et al. | |
| 2017/0203511 A1 | 7/2017 | Burkhart et al. | |
| 2017/0361418 A1 | 12/2017 | Twelves et al. | |
| 2018/0095480 A1 | 4/2018 | Bauer | |
| 2020/0071832 A1 | 3/2020 | Lau et al. | |
| 2020/0332437 A1* | 10/2020 | Burrows ............ | H01L 21/0254 |

FOREIGN PATENT DOCUMENTS

| | | |
|---|---|---|
| KR | 2014-0039720 A | 4/2014 |
| KR | 101841201 B1 | 3/2018 |
| TW | I551720 B | 10/2016 |
| WO | 2014/189622 A1 | 11/2014 |

OTHER PUBLICATIONS

Xuanping Wang et al., Finishing of Additively Manufactured Metal Parts by Abrasive Flow Machining, Proceedings of the 26th Annual International Solid Freeform Fabrication Symposium. 2016. pp. 2470-2472. (Year: 2016).
Strem Chemicals, Inc., Stainless Steel Bubblers: Vertical Electropolished (DOT 4B, UN stamped)., 2016. pp. 1-2. (Year: 2016).
Bal Seal Engineering Europe B.V., TR-51: Measuring Surface Finishes (Rev. B; Apr. 25, 2001), 2001. pp. 1-8. (Year: 2001).
LJ Star Incorporated, Surface Finish: An Important Characteristic in Fluid System Components, 2011. pp. 1-5. (Year: 2011).
V. K. Srivastava, A Review on Advances in Rapid Prototype 3D Printing of Multi-Functional Applications, Science and Technology, 7 [1] 2017. pp. 4-24. (Year: 2017).
Office Action for U.S. Appl. No. 16/539,317 dated Aug. 31, 2021.
Final Office Action for U.S. Appl. No. 16/539,317 dated Jan. 24, 2022.
TW Office Action dated Mar. 20, 2023 for Application No. 108129773.

* cited by examiner

CHAMBER INJECTOR

CROSS-REFERENCE TO RELATED APPLICATIONS

This application is a continuation of U.S. patent application Ser. No. 16/539,317, filed Aug. 13, 2019, which claims benefit of U.S. Provisional Patent Application No. 62/750,376, filed Oct. 25, 2018, and claims benefit of IN201841032311, filed Aug. 29, 2018, all of which are herein incorporated by reference in their entirety.

BACKGROUND

Field

Embodiments disclosed herein generally relate to the field of semiconductor manufacturing equipment, and more specifically, an apparatus for gas injection with active cooling and gas separation.

Description of the Related Art

Hot surfaces within CVD process chambers and components thereof may lead to the decomposition of the precursors which results in deposition on the chamber components before reaching the processing volume. For example, heating of a channel used to deliver the precursors to the processing volume may cause undesirable deposition within the channel. This premature decomposition results in clogging of the flow path and may alter flow characteristics of the precursors into the processing volume. Continued deposition on these surfaces not only impedes flow of the precursors but may also lead to stress and coefficient of thermal expansion (CTE) induced delamination of a deposited film. The CTE induced delamination may generate particles in the processing volume.

Thus, what is needed in the art are improved gas injection apparatus and methods of fabricating gas injection apparatus.

SUMMARY

In one embodiment, an injector apparatus is provided which includes an injector body. The injector apparatus includes a first arcuate surface of the injector body having a first outlet formed therein. The first outlet is in fluid communication with a first conduit formed within the injector body. A second arcuate surface of the injector body has a second outlet formed therein. The second outlet is in fluid communication with a second conduit formed within the injector body. The injector apparatus also includes a channel formed within the injector body. A first portion of the channel is disposed on a first side of the first conduit and a second side of the first conduit opposite the first side of the first conduit adjacent to the first arcuate surface. A second portion of the channel is formed within the injector body, the second portion of the channel being disposed on a first side of the second conduit and a second side of the second conduit opposite the first side of the second conduit adjacent to the second arcuate surface.

In another embodiment, a substrate processing apparatus is provided which includes a chamber body enclosing a process volume, a housing structure enclosing the chamber body, a plurality of heating lamps disposed within the housing structure, a first quartz window disposed within the housing structure between the process volume and the plurality of heating lamps, and an injector apparatus coupled to the chamber body. The injector apparatus includes a first arcuate surface of the injector body having a first outlet formed therein. The first outlet is in fluid communication with a first conduit formed within the injector body. A second arcuate surface of the injector body has a second outlet formed therein. The second outlet is in fluid communication with a second conduit formed within the injector body. The injector apparatus also includes a channel formed within the injector body. A first portion of a channel is disposed on a first side of the first conduit and a second side of the first conduit opposite the first side of the first conduit adjacent to the first arcuate surface. A second portion of the channel is formed within the injector body, the second portion of the channel being disposed on a first side of the second conduit and a second side of the second conduit opposite the first side of the second conduit adjacent to the second arcuate surface.

In yet another embodiment, a structure embodied in a machine readable medium used in a design process is provided. The structure includes an injector body. The structure also includes a first arcuate surface of the injector body having a first outlet formed therein. The first outlet is in fluid communication with a first conduit formed within the injector body. A second arcuate surface of the injector body has a second outlet formed therein. The second outlet is in fluid communication with a second conduit formed within the injector body. The injector apparatus also includes a channel formed within the injector body. A first portion of a channel is disposed on a first side of the first conduit and a second side of the first conduit opposite the first side of the first conduit adjacent to the first arcuate surface. A second portion of the channel is formed within the injector body, the second portion of the channel being disposed on a first side of the second conduit and a second side of the second conduit opposite the first side of the second conduit adjacent to the second arcuate surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to apparatus for fabricating semiconductor devices. A gas injection apparatus is coupled to a first gas source and a second gas source. Gases from the first gas source and second gas source may remain separated until the gases enter a process volume in a process chamber. A coolant is flowed through a channel in the gas injection apparatus to cool the first gas and the second gas in the gas injection apparatus. The coolant functions to prevent thermal decomposition of the gases by mitigating the influence of thermal radiation from the process chamber. In one embodiment, the channel surrounds a first conduit with the first gas and a second conduit with the second gas.

The injector apparatus is also configured to reduce the influence of thermal energy radiating from the process volume by insulating and/or cooling the precursor gases before the gases enter the process volume. In one embodiment, the injector apparatus includes a channel formed therein. Cooling fluid is flowed through the channel to remove heat absorbed by the injector apparatus from the process volume.

Figure 1:
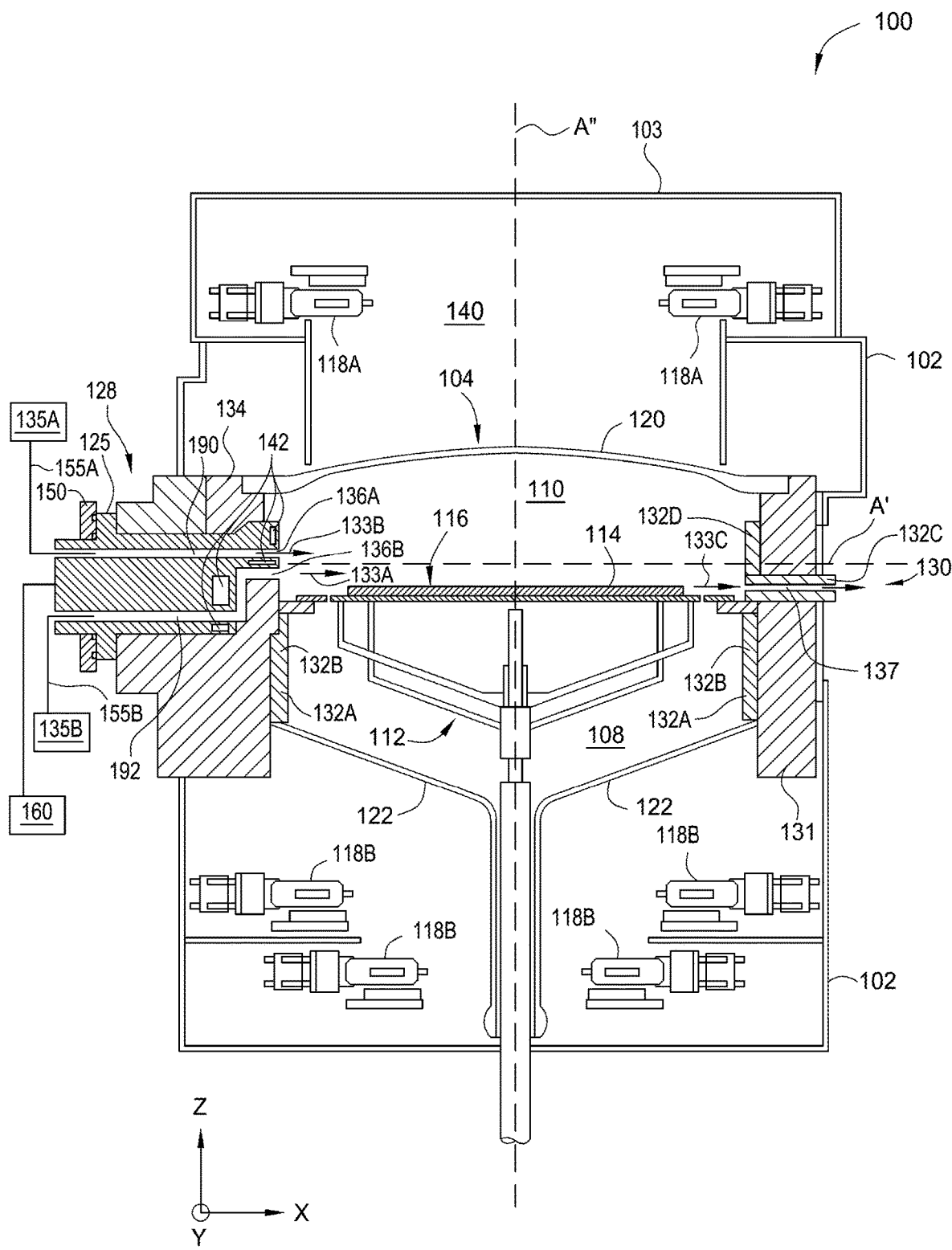
FIG. 1 illustrates a schematic side cross-sectional view of a process chamber according to an embodiment of the disclosure.

FIG. 1 is a schematic side cross-sectional view of a process chamber 100 according to an embodiment described herein. The process chamber 100 may be utilized for performing chemical vapor deposition, such as epitaxial deposition processes, although the process chamber 100 may be utilized for etching or other processes. Non-limiting examples of the process chamber 100 include the CENTURA® RP EPI reactor, which is commercially available from Applied Materials, Inc. of Santa Clara, Calif. While the process chamber 100 described herein may be utilized to practice various embodiments described herein, other suitably configured process chambers from different manufacturers may also be used to practice the embodiments described in this disclosure.

The process chamber 100 includes a housing structure 102 fabricated from a process resistant material, such as aluminum or stainless steel. The housing structure 102 encloses various functioning elements of the process chamber 100, such as a quartz chamber 104, which includes a process volume 110, an additional volume 108, and a baseplate 131 in which a process volume 110 is defined. A substrate support 112 is disposed in and adapted to receive a substrate 114 within the quartz chamber 104. In one embodiment, the substrate support 112 if fabricated from a ceramic material. In another embodiment, the substrate support 112 is fabricated from a graphite material coated with a silicon containing material, such as a silicon carbide material. A lid 103 is disposed on the housing structure opposite the quartz chamber 104. The lid 103 at least partially defines a volume 140 between the quartz chamber 104 and the lid 103.

Reactive species derived from one or more precursors are exposed to a process surface 116 of the substrate 114. Byproducts from deposition processes and the reactive species exposure are subsequently removed from the process surface 116. Heating of the substrate 114 and/or the process volume 110 is performed by one or more radiation sources, such as lamp modules 118A and 118B. In one embodiment, the lamp modules 118A and 118B are infrared lamps.

Radiation from the lamp modules 118A and 118B travels through a first quartz window 120 of the quartz chamber 104, and through a second quartz window 122 of the quartz chamber 104. In this embodiment, the first quartz window 120 and the second quartz window 122 are fabricated from a quartz containing material which is substantially transparent to a wavelength of the radiation emitted from the lamp modules 118A and 118B. In one embodiment, the first quartz window 120 and the second quartz window 122 are disposed opposite one another. In one embodiment, the first quartz window 120 is positioned between the lamp modules 118A and the process volume 110. In another embodiment, the second quartz window 122 is positioned between the lamp modules 118B and the process volume 110.

Reactive species are delivered to the quartz chamber 104 by a gas injector apparatus 128. In one embodiment, the injector apparatus 128 is a unitary body with one or more conduits and channels formed therein, as discussed in detail hereinafter. Processing byproducts are removed from the process volume 110 by an exhaust assembly 130 which is in fluid communication with a vacuum source (not shown). Precursor reactant materials, as well as diluent, purge, and vent gases for the process chamber 100 enter the process volume 110 through the gas injector apparatus 128 and exit the process volume 110 through the exhaust assembly 130.

The process chamber 100 also includes multiple liners 132A-132D which shield the baseplate 131 and metallic walls 134 from the process volume 110. In one embodiment, the liners 132A-132D include a process kit that covers all metallic components that may be in communication with or otherwise exposed to the process volume 110. Liner 132A is disposed in the additional volume 108. Liner 132B is disposed at least partially in the additional volume 108 and is adjacent the liner 132A. An exhaust insert liner assembly 132C is disposed adjacent the liner 132B. The exhaust liner 132D may be disposed adjacent the exhaust insert liner assembly 132C and may replace a portion of the liner 132B to facilitate installation.

The injector apparatus 128 includes an injector body 125 with a plurality of conduits, such as a first conduit 190, a second conduit 192, formed therein. One or more gases are provided to the process volume 110 from a first gas source 135A and a second gas source 135B through the first conduit 190 and the second conduit 192, respectively. For example, the first gas source 135A provides a first gas to the process volume 110 via the first conduit 190 formed in the injector body 125 and the second gas source 135B provides a second gas to the process volume 110 through the second conduit 192 formed in the injector body 125. The first conduit 190 and the second conduit 192 keep the first and second gases separated until the gases reach the process volume 110.

One or more first valves (not shown) are disposed on one or more conduits 155A which couple the first gas source 135A to the process chamber 100. Similarly, one or more second valves (not shown) are disposed on one or more conduits 155B which couple the second gas source 135B to the process chamber 100. The first valves and the second valves are adapted to control the flow of gas from the gas sources 135A, 135B. The first valves and the second valves may be any type of suitable gas control valve, such as a needle valve or a pneumatic valve. In one embodiment, the one or more first valves are configured to provide a greater flow of gas from the first gas source 135A to a center region of the substrate 114. Each of the first valves and the second valves are controlled independently of one another and each of the first valves and the second valves are at least partially responsible for determining gas flow within the process volume 110.

Gas from both the first gas source 135A and the second gas source 135b travels through the one or more outlets 136A and 136B formed in the injector body 125. In one embodiment, gas provided from the first gas source 135A travels through the outlet 136A and gas provided from the second gas source 135B travels through the outlet 136B. In some embodiments, the outlet 136A is a first outlet and the outlet 136b is a second outlet. In another embodiment, the first gas source 135A provides a first process gas and the second gas source 135b provides a second process gas different from the first process gas. A coolant fluid is provided to the gas injector apparatus 128 via a coolant source 160. The coolant fluid is flowed through a channel 142 formed in the injector body 125.

The one or more outlets 136A and 136B formed in the injector body 125 are coupled to outlets configured for a laminar flow path 133A or a jetted flow path 133B. The outlets 136A and 136B are configured to provide individual or multiple gas flows with varied parameters, such as velocity, density, or composition. In one embodiment where multiple outlets 136A and 136B are adapted, the outlets 136A and 136B are distributed along a portion of the gas injector apparatus 128 (e.g., injector body 125) in a substantially linear arrangement to provide a gas flow that is wide enough to substantially cover the diameter of the substrate 114. For example, each of the outlets 136A and 136B are arranged in at least one linear group to provide a gas flow generally corresponding to the diameter of the substrate. Alternatively, the outlets 136A and 136B are arranged in substantially the same plane or level for flowing the gas(es) in a planar, laminar fashion. The outlets 136A and 136B may be spaced evenly along the injector liner 132E or may be spaced with varying densities. For example, one or both of the outlets 136A and 136B may be more heavily concentrated at a region of the injector liner 132E corresponding to a center of the substrate.

In some embodiments, the density of outlets 136A is greater than a density of outlets 136B. For example, each outlet 136B formed in the injector body 125 corresponds to a plurality of outlets 136A. Additionally, a size and shape of outlets 136b may differ from a size and shape of the outlets 136A, as discussed below with respect to FIG. 2.

Each of the flow paths 133A, 133B is configured to flow across a longitudinal axis A" of the process chamber 100 in a laminar or non-laminar flow fashion to the exhaust liner 132D. The flow paths 133A, 133B are generally coplanar with the axis A' or may be angled relative to the axis A'. For example, the flow paths 133A, 133B may be angled upward or downward relative to the axis A'. The axis A' is substantially normal to the longitudinal axis A" of the process chamber 100. The flow paths 133A, 133B culminate in an exhaust flow path 133C and flow into a plenum 137 formed in the exhaust liner 132D. The plenum 137 is coupled to an exhaust or vacuum pump (not shown).

Figure 2:
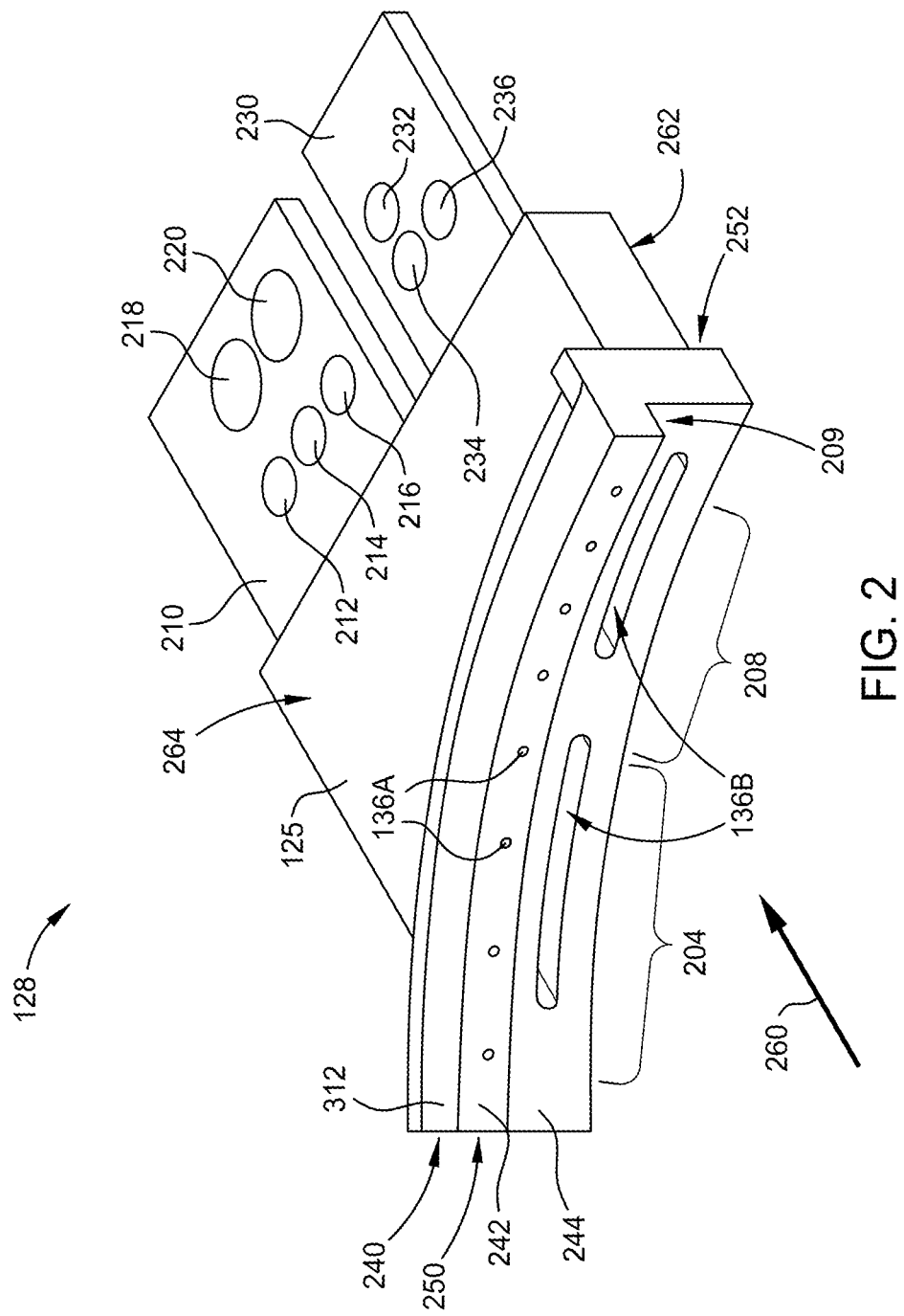
FIG. 2 illustrates a front perspective view of an injector apparatus according to an embodiment of the disclosure.

The injector apparatus 128 shown in FIGS. 2-6 may be used to practice various embodiments of the deposition process discussed in this disclosure. FIG. 2 illustrates a perspective view of one embodiment of an injector apparatus 128. As shown, the injector apparatus 128 includes the injector body 125, a first protrusion 210, a second protrusion 230, and a projection 240. The projection 240 includes a first arcuate surface 242 and a second arcuate surface 244. In one embodiment, the first arcuate surface 242 is disposed radially inward of the second arcuate surface 244. A surface 209 of the projection 240 extends from the second arcuate surface 244 to the first arcuate surface 242. The surface 209 is substantially normal to the first and second arcuate surfaces 242 and 244. The surface 209 is a ledge surface connecting the first arcuate surface 242 and the second arcuate surface 244.

A first plurality of outlets 136A is formed in the first arcuate surface 242. The plurality of outlets 136A are in fluid communication with a conduit (not shown) formed within the injector body 125, such as the first conduit 190 illustrated in FIG. 1. While each of the first plurality of outlets 136A is circular in FIG. 1, the outlets 136A may take many other shapes, such as ellipsoidal, conical, etc. A volume of each of the first plurality of outlets 136A may be changed based on gas flow parameters to perform a process in the process chamber 100.

A second plurality of outlets 136B is formed in the second arcuate surface 244. In one embodiment, each of the outlets 136B are a continuous opening formed in the second arcuate surface 244 and in fluid communication with a conduit (not illustrated) formed within the injector body 125, such as the second conduit 192 in FIG. 1. A volume of the outlet 136b in a first portion 204 of the projection 240 is greater than a combined volume of the plurality of outlets 136A in the first arcuate surface 242 and in the first portion 204 of the projection 240. Similarly, a volume of outlet 136B in a second portion 208 of the projection 240 may be greater than a combined volume of the outlets 136A in the second portion 208 of the projection 240.

In operation, a first process gas enters the process volume 110 through the outlets 136A in the first portion 204 of the projection 240. The first process gas may also enter the process volume 110 through the outlets 136A in the second portion 208 of the projection 240. The gas entering the process volume 110 through the outlets 136A in the second portion 208 may be at a different flow rate than the gas entering through the outlets 136A in the first portion 204. Different flow rates of the first process gas enable the gas to reach different areas within the process volume 110. For example, a higher flow rate of the first process gas projects the gas further into the process volume 110 than a lower flow rate. In addition, the smaller volume of the outlets 136A in the first arcuate surface 242 may cause an increase in a velocity of the process gas entering the process volume 110 according to Bernoulli's principle.

A second process gas enters the process volume 110 through the outlets 136B. In one embodiment, the second process gas enters the process volume 110 at a different velocity and flow rate than the first process gas. For example, the second process gas may not be affected by Bernoulli's principle to the extent of the first process gas flowing through outlets 136A. Thus, the first process gas may flow further from the first arcuate surface 242 and into the process volume 110 than the second process gas. In one embodiment, the first process gas is Trimethylgallium (TMGa) and the second process gas is ammonia ($NH_3$).

As shown, the first protrusion 210 includes connections 212, 214, 216, 218, and 220 for various fluid sources (not shown). Connection 212 is in fluid communication with the outlets 136A in the first portion 204 of the projection 240 via a first conduit (not shown) formed within the injector body 125. Similarly, connection 214 is in fluid communication with the outlet 136B in the first portion 204 of the projection 240 via a second conduit (not shown) formed within the injector body 125. Connection 216 may be in fluid communication with a first purge outlet, as discussed with respect to FIG. 3, to provide a purge gas to a portion of the process volume 110 via a third conduit (not shown) formed within the injector body 125.

Connection 220 is in fluid communication with connection 218 via a channel (not shown) formed within the injector body 125. The channel is formed within the injector body 125 from the connection 220 to a first end 250 of the projection 240. The channel continues within the projection 240 and adjacent to the first arcuate surface 242 to a second end 252 of the projection 240. The channel continues in the projection 240 adjacent to the second arcuate surface 244 to the first end 250, where the channel is fluidly connected to the connection 218. Many other variations of a design of the channel are possible. For example, the channel may flow only one direction through the projection 240. Further, a shape of the channel may be modified to achieve desired heat transfer from the injector body 125 to the cooling fluid.

A first portion of the channel within the projection 240 adjacent to the first arcuate surface 242 is disposed on a first side and a second side of the first conduit which is in fluid communication with each of the outlets 136A. A second portion of the channel within the projection 240 adjacent to the second arcuate surface 244 is disposed on a first side and a second side of the second conduit which is in fluid communication with the outlets 136B. A cooling fluid enters the injector body 125 through the connection 220, flows through the channel adjacent to the first arcuate surface 242 from the first end 250 to the second end 252, flows through the channel adjacent to the second arcuate surface 244 from the second end 252 to the first end 250, and exits the injector body through the connection 218. In some embodiments, the cooling fluid enters the injector body 125 through connection 218 and exits the injector body 125 through connection 220.

The second protrusion 230 includes connections 232, 234, and 236 for fluid sources (not shown). Connection 234 is in fluid communication with outlets 136A in the second portion 208 of the projection 240 via a fourth conduit (not shown) formed within the injector body 125. Connection 236 is in fluid communication with the outlet 136B in the second portion 208 of the projection 240 via a fifth conduit (not shown) formed within the injector body 125. Connection 232 is in fluid communication with a second purge outlet, as discussed with respect to FIG. 3, via a sixth conduit (not shown) formed within the injector body 125.

To form the conduits and channels within the injector body 125, traditional subtractive manufacturing methods are insufficient. For example, to accommodate each of the conduits and channels within the injector body 125, the conduits and channels may be curved and comprise turns wholly within the injector body. Traditional subtractive methods are not able to conform to the intricate paths of the conduits and channels. However, additive manufacturing techniques, such as 3D printing, can be used to design and manufacture the injector apparatus 128 with the conduits and channels formed therein.

In one embodiment, the injector apparatus 128 is fabricated using additive manufacturing, such as 3D printing. A print direction of the injector apparatus 128 is illustrated by an arrow 260, which is orthogonal to a direction between a first surface 262 of the injector body 125 and a second surface 264 of the injector body 125. The second surface 264 is opposite and parallel to the first surface 262. That is, the first arcuate surface 242 is formed before the second arcuate surface 244, and the second arcuate surface 244 is formed before the injector body 125. Printing the injector apparatus 128 in the direction of the arrow 260 enables features of the injector apparatus 128 (e.g., the outlets 136A, 136B, the conduits and channels, the projection 240, etc.) to be printed accurately and reduces an occurrence of deformed features of the injector apparatus 128.

Alternatively or in addition to additive manufacturing, abrasive flow machining may be used to form the conduits and channels within the injector body 125. Abrasive flow machining may reduce or eliminate utilization of post-processing operations to smooth an interior surface of the conduits and channels. Further, abrasive flow machining may be used in post-processing to smooth the interior surface of the conduits and channels. In one embodiment, the injector apparatus 128 is made of a process and corrosion resistant material such as 316 stainless steel or Inconel®, or alloys thereof. More specifically, the material of the injector apparatus 128 is selected to be resistant to corrosion caused by a cleaning fluid such as chlorine. The cleaning fluid may be used to remove deposited particles in the process chamber 100 and within the conduits and channels.

Figure 3:
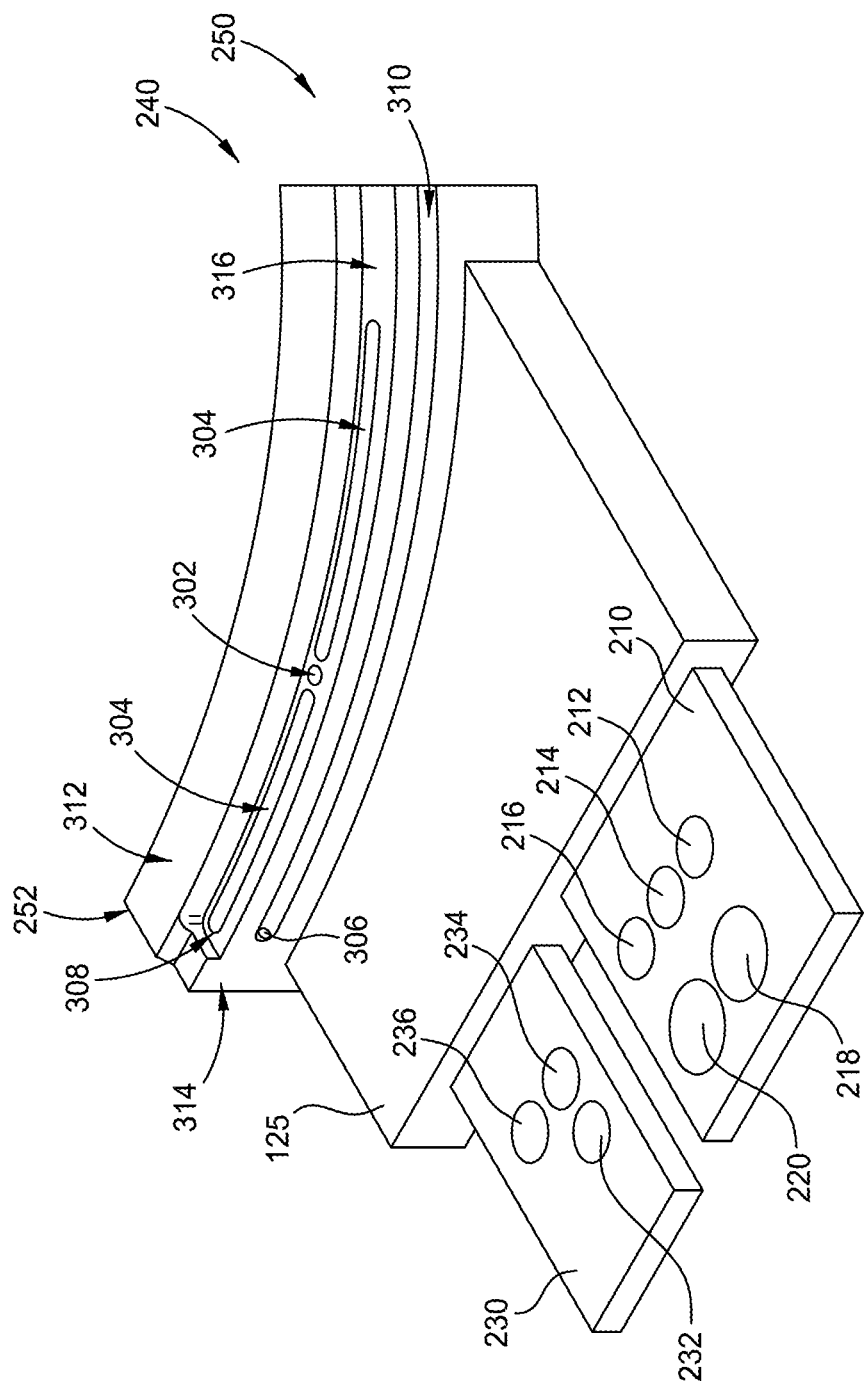
FIG. 3 illustrates a rear perspective view of the injector apparatus of FIG. 2 according to an embodiment of the disclosure.

FIG. 3 illustrates a perspective view of one embodiment of the injector apparatus 128 opposite the perspective view of FIG. 2. A recess 308 is formed into a surface 312 of the projection 240 adjacent to the first arcuate surface 242. The surface 312 is an upper surface of the projection 240. A first purge outlet 302 is formed into a surface 316 of the recess 308 and is in fluid communication with connection 216 via the third conduit (not shown) formed within the injector body 125. The surface 316 is a recessed surface from the surface 312 of the projection 240 and may be referred to as a third surface of the injector body 125. Although one first purge outlet 302 is depicted in FIG. 3, a plurality of first purge outlets 302 may be formed in the surface 316. The first purge outlet 302 may also be referred to as a third outlet.

A channel 310 is formed into a surface 314 of the projection 240 opposite the first arcuate surface 242 and adjacent to the surface 316. The surface 314 is an outer surface of the projection 240. The channel 310 is formed into the surface 314 and advances from a second purge outlet 306 to the second end 252 of the projection 240. The second purge outlet 306 is in fluid communication with the channel 310. The second purge outlet is also in fluid communication with connection 232 via the sixth conduit (not shown) formed within the injector body 125. In operation, a second purge gas flows through channel 310 to prevent particles from entering into the process volume 110. The second purge gas may include hydrogen, nitrogen, ammonia, other like gases, and any combination thereof.

In some embodiments, caps 304 are disposed on the surface 316 in the recess 308. The caps 304 are adhered to the surface 316 via a weld and may be fabricated from the same or a similar material as the injector apparatus 128. The caps 304 confine a volume of the third conduit which is in fluid communication with connections 218 and 220. The caps 304 enable an interior surface of the third conduit to be smoothed after the injector body 125 is formed. Further, with the caps 304 removed, an electro plating process can be performed on an interior surface of the conduits (and channels) to increase corrosion resistance. Post-processing (e.g., smoothing and electro-plating) of the conduits and channels may prevent condensation and agglomeration of a gas flowing therethrough from impeding flow through the injector body 125. Thus, post-processing is believed to decrease maintenance intervals for cleaning the interior of the injector body 125. After post-processing, an RMS surface roughness of the interior surface of the conduits and channels may be less than about 50 microns, for example, less than about 25 microns, for example less than about 5 microns, such as less than about 0.5 microns.

Figure 4A:
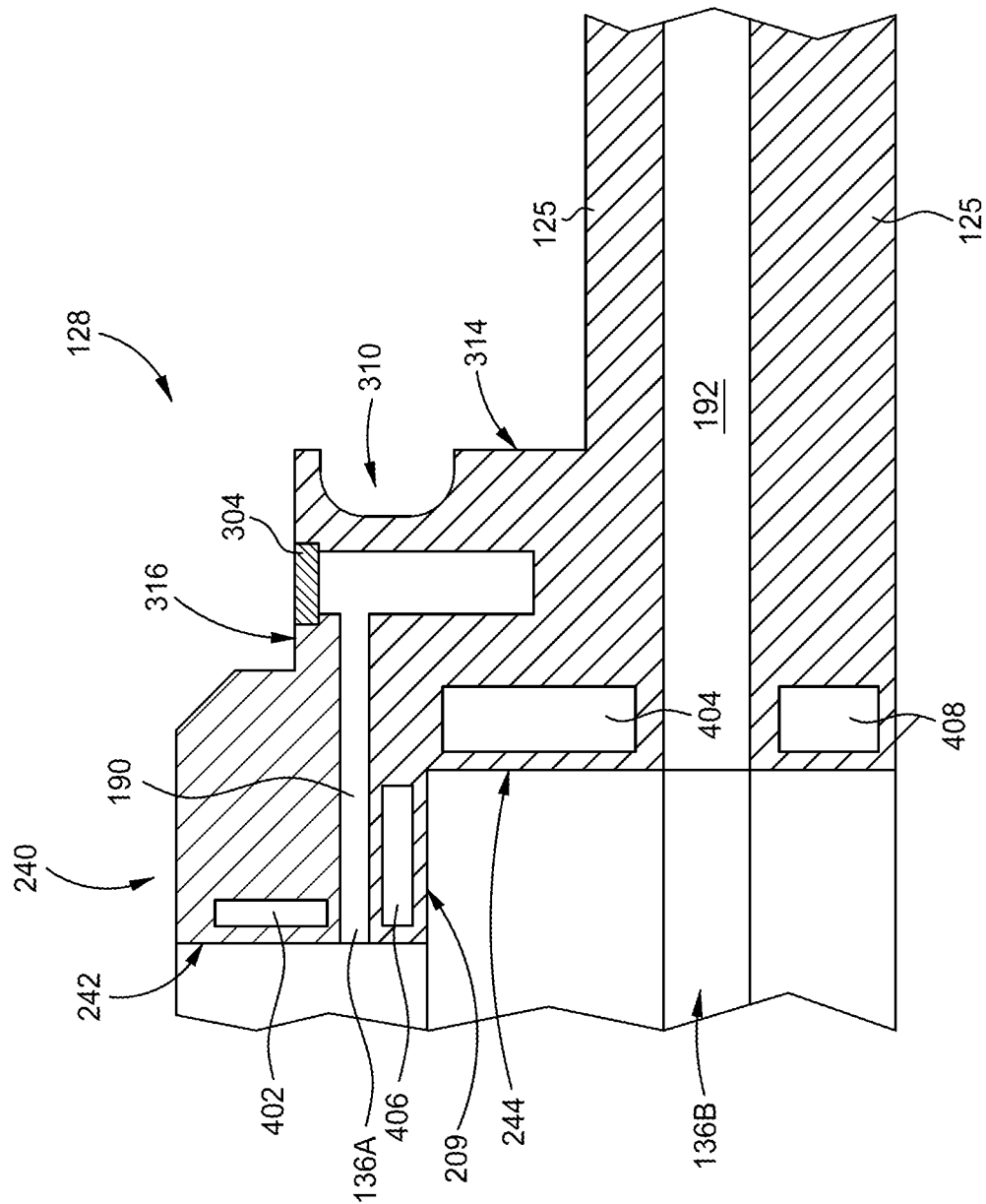
FIG. 4A illustrates a schematic side cross-sectional view of a portion of the injector apparatus according to an embodiment of the disclosure.

FIG. 4A illustrates a schematic side cross-sectional view of a portion of an injector apparatus 128. As shown, the channel 310 is recessed into the surface 314 of the injector apparatus 128. A first channel 402, 406 and a second channel 404, 408 are formed within the injector apparatus 128. A first portion of the first channel 402 is disposed on a first side of the first conduit 190 adjacent the first arcuate surface 242. A second portion of the first channel 406 is disposed on a second side of the first conduit 190 opposite the first side of the first conduit 190. The second portion of the first channel 406 is adjacent the first arcuate surface 242 and adjacent the surface 209 of the projection 240.

A first portion of the second channel 404 is disposed on a first side of the second conduit 192 adjacent the second arcuate surface 244. A second portion of the second channel 408 is disposed on a second side of the second conduit 192 opposite the first side of the second conduit 192. The second portion of the second channel 408 is adjacent the second arcuate surface 244.

The first and second portions of the first channel 402, 406 are in fluid communication with the first and second portions of the second channel 404, 408. A volume of the first and second portions of the first channel 402, 406 is less than a volume of the first and second portions of the second channel 404, 408 to increase a rate of flow through the first and second portions of the first channel 402, 406 (assuming constant fluid pressure). That is, a rate of flow of cooling fluid flowing through the first channel 402, 406 will be greater than a flow rate of cooling fluid flowing through the second channel 404, 408. The greater flow rate in first channel 402, 406 enables the cooling fluid in the first channel 402, 406 to absorb and remove a greater amount of heat from the injector apparatus 128 adjacent to the first arcuate surface 242.

A direction of flow of cooling fluid flowing in the first channel 402, 406 is opposite a direction of flow of the cooling fluid flowing in the second channel 404, 408. In some embodiments, the cooling fluid is water. The rate of cooling fluid flowing through the injector apparatus 128 is selected to maintain a temperature of the channels and conduits at a desired temperature. For example, a maximum temperature of the injector apparatus 128 may be maintained at about 300 degrees Celsius. A pressure of the cooling fluid flowing through the injector apparatus 128 may be between about 20 psi and about 80 psi. This pressure produces a flow rate of the cooling fluid of between about 1 gallon per minute and about 5 gallons per minute. In one embodiment, the flow rate of the cooling fluid is about 2 gallons per minute. A higher flow rate of the cooling fluid may improve efficiency of cooling the injector apparatus 128.

As shown, a surface of the cap 304 confining a volume of the first conduit or fourth conduit is co-planar with the surface 316. As described above, a volume of the first conduit 190 is less than a volume of the second conduit 192. The smaller volume of the first conduit 190 increases a velocity of a fluid flowing through the first conduit 190 to the outlet 136A when compared to the fluid flow velocity through the second conduit 192, assuming an approximately and substantially constant fluid pressure for each of the first conduit 190 and the second conduit 192.

Figure 4B:
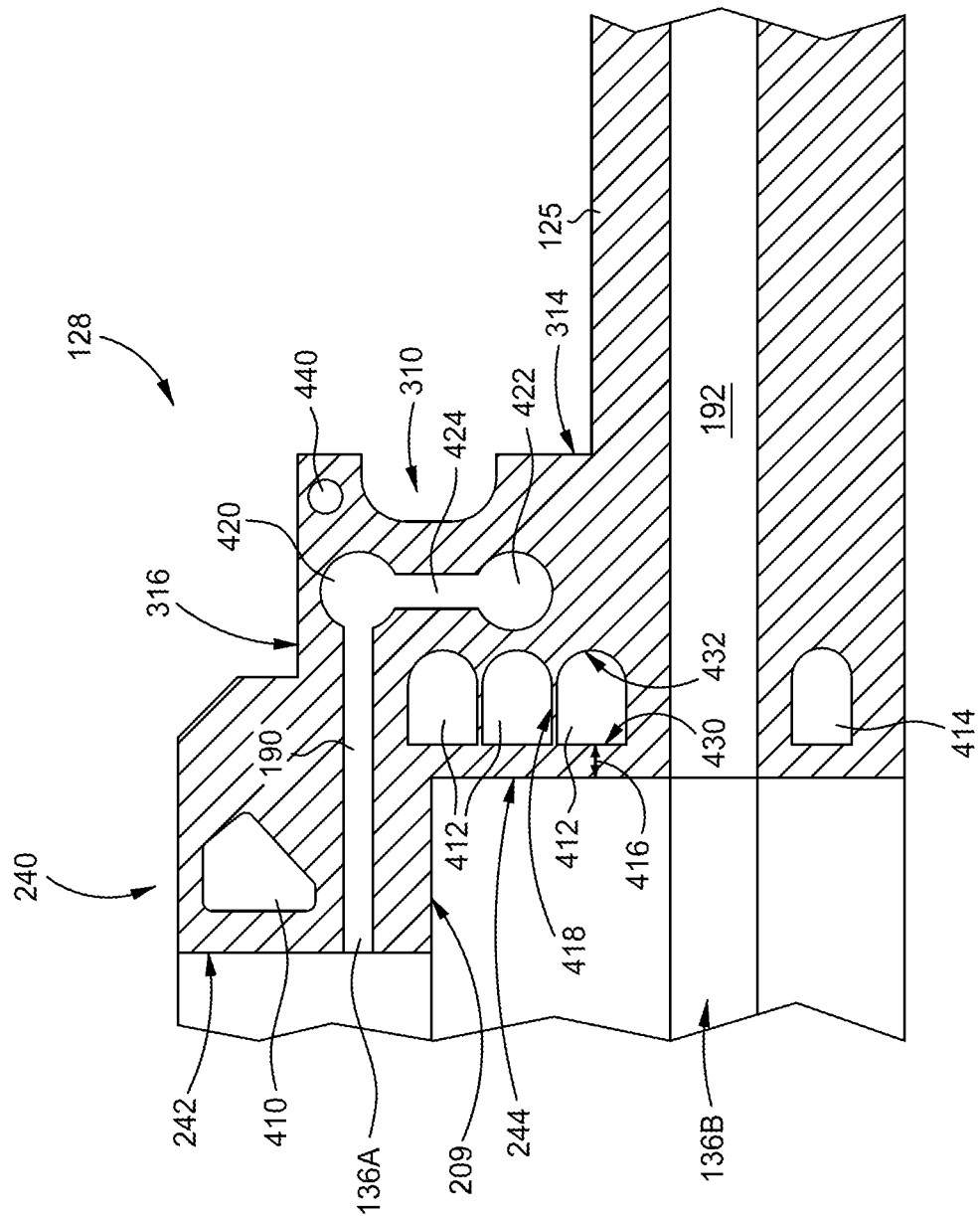
FIG. 4B illustrates a schematic side cross-sectional view of a portion of the injector apparatus according to an embodiment of the disclosure.

FIG. 4B illustrates a schematic side cross-sectional view of a portion of the injector apparatus 128 according to an embodiment of the disclosure. A first channel 410, a second channel 412, and a third channel 414 are formed in the injector apparatus 128. The first channel 410 is formed within the projection 240 of the injector apparatus 128 adjacent to the first arcuate surface 242. The second channel 412 is formed adjacent to the second arcuate surface 244 and adjacent to the surface 209 of the projection 240. The second channel 412 is disposed on a first side of the second conduit 192. The third channel 414 is formed adjacent to the second arcuate surface 244 and is disposed on a second side of the second conduit 192 opposite the first side of the second conduit 192.

A shape of the first channel 410 is configured to enable additive manufacturing to be used to fabricate the first channel within the injector apparatus 128. In one embodiment, one or more pillars 418 extend through the second channel 412 and divide the second channel 412 into two or more portions. Each portion of the second channel 412 has a similar shape and size. In one embodiment, a shape or size of each portion of the second channel 412 may be different than the adjacent portions of the second channel 412. The pillars 418 are fabricated to support the adjacent portions of the second channel 412 during the additive manufacturing process. Thus, the pillars 418 enable fabrication of the second channel 412 using the additive manufacturing process.

Fabrication of each portion of the second channel 412 begins at a flat surface 430. The portions of the second channel 412 are formed in the injector body 125 by adding material around the second channel 412 as the injector apparatus 128 is fabricated. The flat surface 430 of the second channel 412 is disposed a distance 416 from the second arcuate surface 244. The distance 416 between the flat surface 430 and the second arcuate surface 244 is between about 1 mm and about 3 mm, for example about 2 mm. A relatively short distance 416 (i.e., minimal thickness) between the second channel 412 and the second arcuate surface 244 increases heat transfer from the injector apparatus 128 to fluid in the second channel 412 during operation of the injector apparatus 128.

A curved surface 432 of the second channel 412 is formed opposite the flat surface 430. The curved surface 432 enables the additive manufacturing process to enclose the second channel 412 without the material used to fabricate the injector apparatus 128 collapsing into the second channel 412. In one embodiment, a size and shape of the third channel 414 is substantially similar to that of each portion of the second channel 412.

A first duct 422 is formed through the injector apparatus. The first duct 422 extends along and parallel to the second arcuate surface 244 from the first end 250 to the second end 252. The first duct 422 is disposed between the second channel 412 and the channel 310. The first duct 422 is in fluid communication with the connections 212 and 234 illustrated in FIGS. 2 and 3. A second duct 420 is fabricated in the injector apparatus 128 adjacent to the surface 316. The second duct 420 extends along and tangential to the projection 240 from the first end 250 to the second end 252. The second duct 420 is parallel to the first duct 422. One or more tubes 424 extend between the first duct 422 and the second duct 420. In one embodiment, the first duct 422 and second duct 420 are semi-toroidal. In one embodiment, the one or more tubes 424 are cylindrical. The first duct 422 and the second duct 420 are in fluid communication via the one or more tubes 424. In one embodiment, a diameter of the first duct 422 is substantially equal to a diameter of the second duct 420.

A third duct 440 is formed in the injector apparatus 128. The third duct is in fluid communication with the connection 216 illustrated in FIGS. 2 and 3. In one embodiment, the third duct 440 extends along the surface 314 and the surface 316. The third duct 440 is disposed between the surface 316 and the channel 310. The third duct 440 is semi-toroidal. In one embodiment, a diameter of the third duct 440 is less than the diameter of the first duct 422 and the diameter of the second duct 420.

Figure 5:
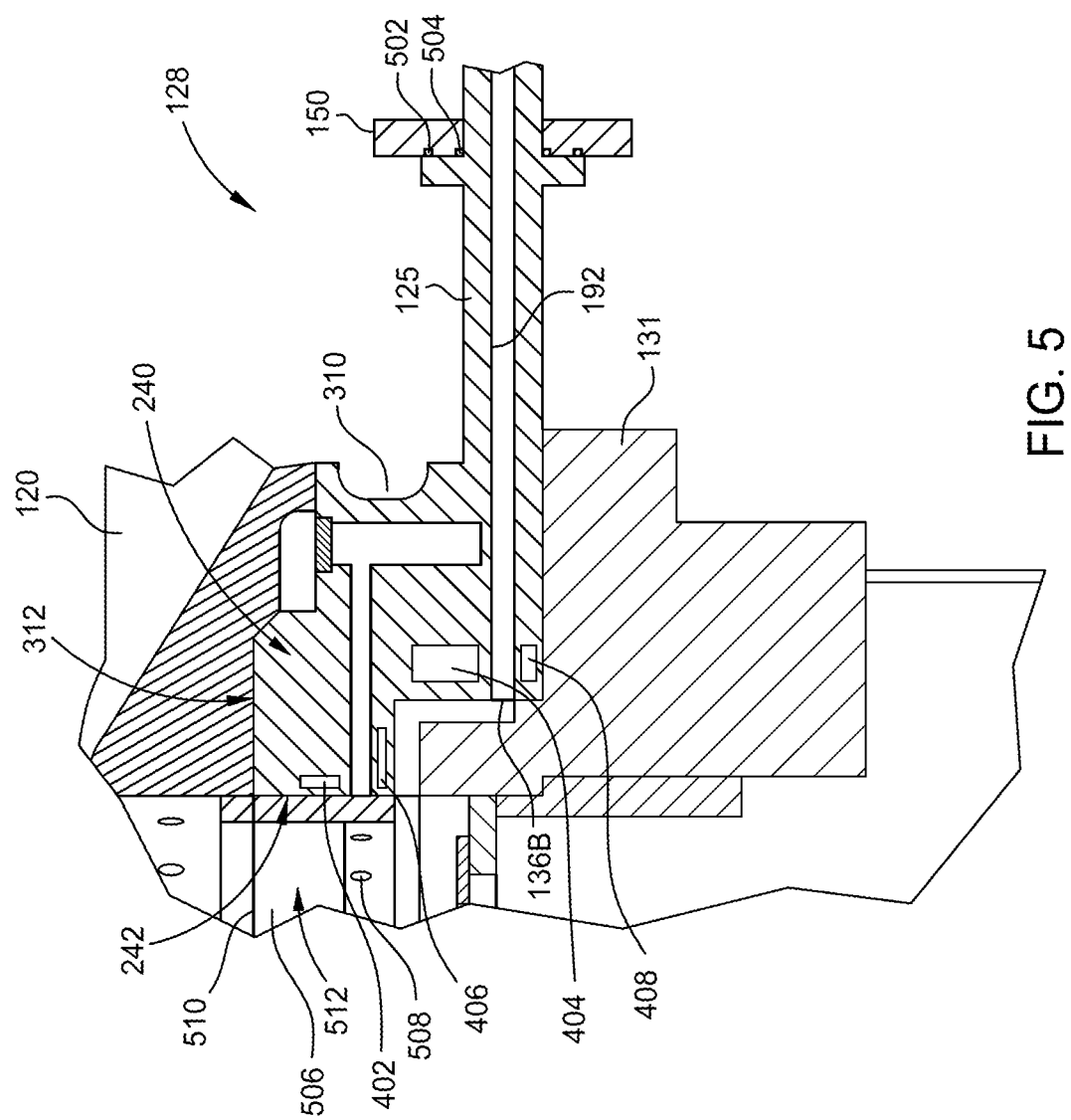
FIG. 5 illustrates a schematic cross-sectional view of the injector apparatus according to an embodiment of the disclosure.

FIG. 5 illustrates a schematic cross-sectional view of the injector apparatus 128. As shown, the injector body 125 of the injector apparatus 128 is disposed through the baseplate 131 of a process chamber, such as process chamber 100 depicted in FIG. 1. A mounting plate 150 mounts the injector apparatus 128 to the baseplate 131 of the process chamber 100. Seals 502 and 504 fluidly seal the process volume 110 from an atmosphere external to the process chamber 100. In one embodiment, the seals 502, 504 are O-rings fabricated from an elastomeric material.

An injector shield 506 is disposed between the process volume 110 and the injector apparatus 128. The injector shield 506 is configured to prevent or substantially reduce thermal radiation from propagating to the injector apparatus 128 from the process volume 110. The injector shield 506 is fabricated from an opaque material, such as an opaque quartz material or a silicon carbide material. The injector shield 506 facing the process volume 110 is coupled to the first arcuate surface 242 of the projection 240 and traverses an entirety of the first arcuate surface 242. The injector shield 506 separates the injector apparatus 128 from the process volume 110 to prevent metal particles from the injector apparatus 128 from entering the process volume 110.

For an injector shield 506 fabricated from a quartz material, a surface 512 of the shield 506 facing the process volume 110 absorbs thermal radiation from the process volume 110 while an opposing surface 616 of the shield 506 facing the injector body 125 remains cooler due to thermal shielding of the quartz shield. For an injector shield 506 fabricated from a silicon carbide material, a temperature of both surfaces 512 and 616 is believed to increase due to thermal radiation in the process volume 110 absorbed by the silicon carbide shield. However, an increase in temperature of the injector shield 506 is offset by the flow of cooling fluid through the first channel 402, 406. During a cleaning process, thermal radiation absorbed by the injector shield 506 is believed to assist in removing deposited material from the surface 512.

One or more holes 508 are formed through the injector shield 506. Each of the holes 508 are aligned with each of the outlets 136A formed in the projection 240. As such, the holes 508 (and the outlets 136A) are in fluid communication with the first conduit 190 formed within the injector body 125. One or more slots 510 are also formed through the injector shield 506. The one or more slots 510 are disposed substantially coplanar with the surface 312 of the projection 240. As such, the one or more slots 510 are disposed horizontally out of plane with the one or more holes 508. The one or more slots 510 are in fluid communication with the first purge outlet 302 (not shown) and the third conduit (not shown) formed within the injector body 125. The one or more slots 510 are discussed in greater detail with respect to FIG. 6.

Figure 6:
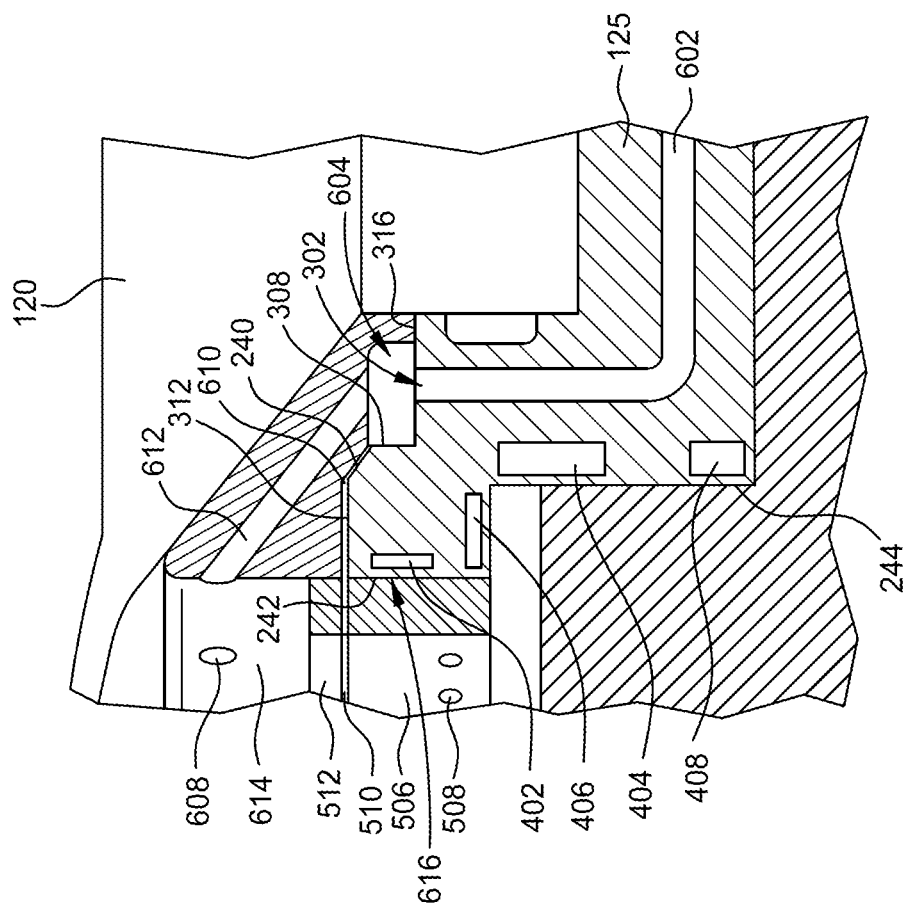
FIG. 6 illustrates a schematic cross-sectional view of a portion of the injector apparatus according to an embodiment of the disclosure.

FIG. 6 illustrates a schematic cross-sectional view of a portion of the injector apparatus 128. As discussed above, the first purge outlet 302 is formed in the surface 316 of the recess 308. A third conduit 602 is formed within the injector body 125. A liner 614 is positioned between the injector shield 506 and the first quartz window 120. One or more outlets 608 are formed through the liner 614. The one or more outlets 608 are in fluid communication with a purge plenum 604 via one or more purge channels 612. The one or more outlets 608 are disposed between the injector shield 506 and the first quartz window 120. The purge plenum is formed between the projection 240 and the liner 614. The purge plenum 604 is in fluid communication with the third conduit 602 via the first purge outlet 302. The one or more slots 510 are also in fluid communication with the purge plenum 604 via one or more purge channels 610. The one or more purge channels 610 may be a gap between the surface 312 and a bottom surface of the liner 614 as the bottom surface 312 of the liner includes at least one portion offset and not contacting the surface 312 of the projection 240.

A first purge gas in the third conduit 602 enters the process volume 110 through the one or more slots 510 and the one or more outlets 608 via the one or more purge channels 610 and 612. The first purge gas flows from the third conduit 602 and into the purge plenum 604 via the first purge outlet 302. The first purge gas flows to the process volume 110 from the purge plenum via the one or more purge channels 610 and 612.

The first purge gas is selected from one or more of hydrogen, nitrogen, ammonia, other like gases, and any combination thereof. The first purge gas enters the process volume 110 through one or both of the one or more slots 510 and the one or more outlets 608 and separates the process gases, which enter the process volume 110 through the holes 508, from contacting the first quartz window 120. The first purge gas prevents or substantially reduces the process gases from expanding in the process volume 110 and from diffusing to the first quartz window 120. In one embodiment, the first purge gas enters the process volume 110 at a rate and velocity different from that of the process gases.

Figure 7:
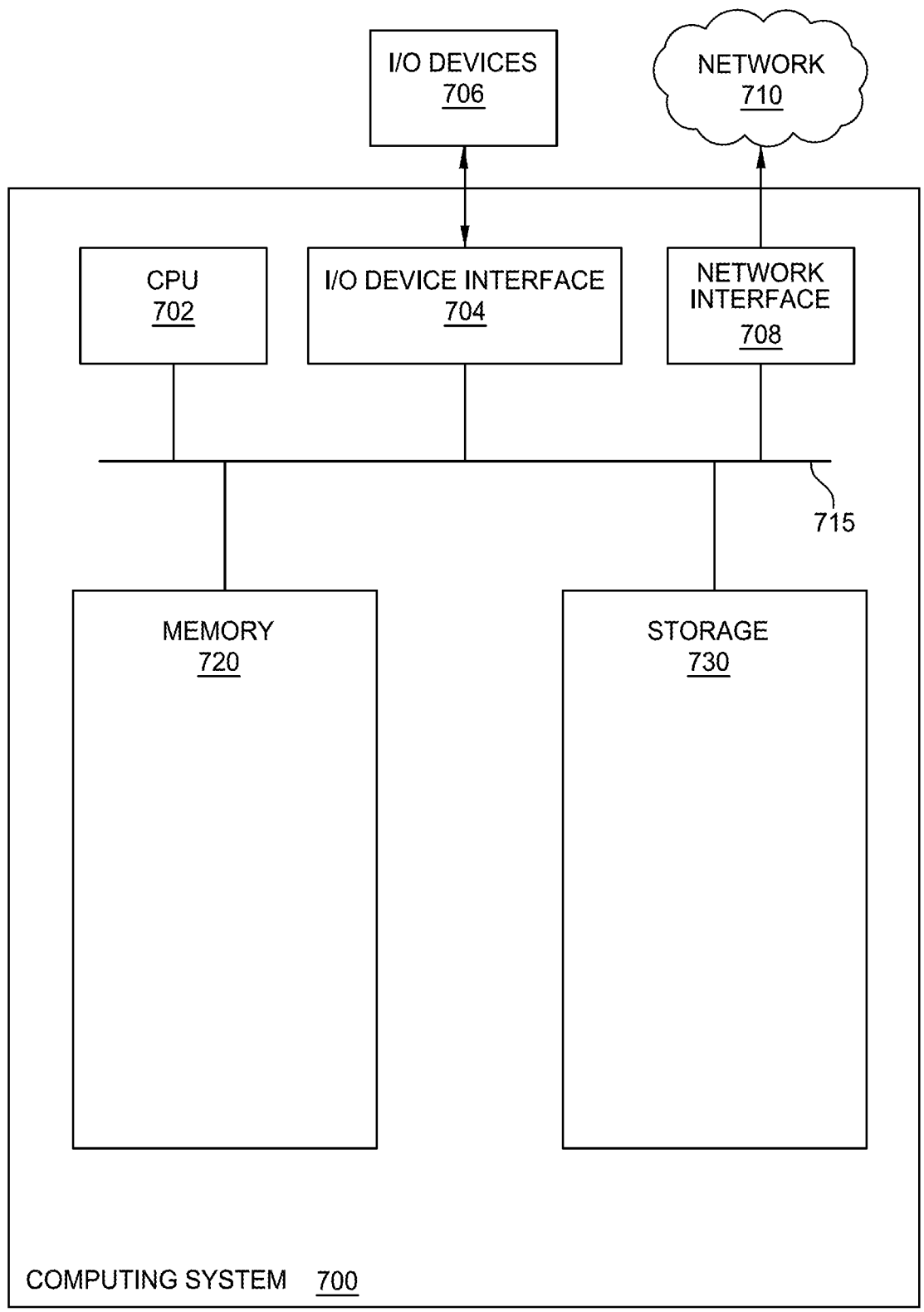
FIG. 7 illustrates a schematic representation of a computer system with a computer-readable medium according to an embodiment of the disclosure.

FIG. 7 illustrates a schematic representation of a computer system 700 with a computer-readable medium according to one embodiment. As shown, the computing system 700 includes a central processing unit (CPU) 702 for executing programming instructions and one or more input/output (I/O) device interfaces 704, which enables connection to various I/O devices 706 (e.g., keyboards, displays, mouse devices, pen inputs, etc.). The system 700 also includes a network interface 708, which may include, for example, a transceiver for transmitting and receiving data from an external network, such as a network 710. The system further includes a memory 720, such as a volatile random access memory, a storage 730, such as a non-volatile disk drive, RAID array, etc., and an interconnect 715, such as a data bus. In some examples, some or all of the storage 730 may be remote from the computing system 700 (not shown) and may instead be accessed via the network interface 708. The CPU 702 retrieves and executes executable instructions stored in the memory 720 via the interconnect 715. The CPU 702 also retrieves and processes data from storage 730.

In one embodiment, an additive manufacturing process, such as three dimensional printing (3-D printing), is used to fabricate an injector apparatus 128 as described herein. In one embodiment, a computer aided design (CAD) model of the injector apparatus 128 is first made and then a slicing algorithm maps the information for every layer. A layer starts off with a thin distribution of powder spread over the surface of a powder bed. A chosen binder material then selectively joins particles where the object is to be formed. Then, a piston, which supports the powder bed and the part-in-progress, is lowered in order for the next powder layer to be formed. After each layer, the same process is repeated followed by a final heat treatment to make the object. Since 3-D printing can exercise local control over the material composition, microstructure, and surface texture, various (and previously inaccessible) geometries may be achieved with this method.

In one embodiment, an injector apparatus 128 as described herein is represented in a data structure readable by a computer rendering device or a computer display device. The computer-readable medium contains a data structure that represents the injector apparatus 128. The data structure is a computer file and contains information about the structures, materials, textures, physical properties, or other characteristics of one or more articles (e.g. the injector apparatus 128). The data structure also contains code, such as computer executable code or device control code that engages selected functionality of a computer rendering device or a computer display device. The data structure is stored on the computer-readable medium, such as the memory 720. The computer readable medium includes a physical storage medium such as a magnetic memory, floppy disk, or any convenient physical storage medium. The physical storage medium is readable by the computer system 700 to render the article represented by the data structure on a computer screen or a physical rendering device which may be an additive manufacturing device, such as a 3D printer.

While the foregoing is directed to embodiments of the present disclosure, other and further embodiments of the disclosed subject matter may be devised without departing from the basic scope thereof, and the scope thereof is determined by the claims that follow.

The invention claimed is:

1. An injector apparatus, comprising:
an injector body;
a first arcuate surface of the injector body, the first arcuate surface having a first outlet formed therein, the first outlet in fluid communication with a first conduit formed within the injector body;
a second arcuate surface of the injector body substantially parallel to the first arcuate surface and offset from the first arcuate surface, the second arcuate surface having a second outlet formed therein, the second outlet in fluid communication with a second conduit formed within the injector body;
a third surface of the injector body, the third surface having a third outlet formed therein, the third outlet in fluid communication with a third conduit formed within the injector body, wherein the third surface is substantially normal to the first arcuate surface and the second arcuate surface and the third outlet is substantially normal to the first outlet and the second outlet;
a first cooling channel formed in the injector body, the first cooling channel having:
a first portion of the first cooling channel disposed around a first side of the first conduit, wherein the first portion of the first cooling channel is adjacent the first arcuate surface; and
a second portion of the first cooling channel disposed around a second side of the second conduit, wherein the second portion of the first cooling channel is adjacent the first arcuate surface and the second arcuate surface; and a second cooling channel formed in the injector body, the second cooling channel having:
a first portion of the second cooling channel disposed around a first side of the second conduit, wherein the first portion of the second conduit is adjacent the second arcuate surface; and
a second portion of the second cooling channel disposed around a second side of the second conduit opposite the first side of the second conduit, wherein the second portion of the second cooling channel is adjacent the second arcuate surface.

2. The injector apparatus of claim 1, wherein the first and second portions of the first cooling channel are in fluid communication with the first and second portions of the second cooling channel.

3. The injector apparatus of claim 1, wherein a volume of the first and second portions of the first cooling channel is less than a volume of the first and second portions of the second cooling channel.

4. The injector apparatus of claim 1, wherein the first arcuate surface is disposed radially inward of the second arcuate surface.

5. The injector apparatus of claim 1, wherein the injector body comprises stainless steel or alloys thereof.

6. The injector apparatus of claim 1, wherein the first conduit and the second conduit are electropolished and have a RMS surface roughness of less than about 0.5 microns.

7. The injector apparatus of claim 1, wherein a distance between a surface of the second cooling channel and the second arcuate surface is about 1 mm to about 3 mm.

8. The injector apparatus of claim 1, wherein the third surface is a recessed surface disposed within an upper surface of the injector body.

9. A substrate processing apparatus, comprising:
a chamber body enclosing a process volume;
a housing structure enclosing the chamber body;
a plurality of heating lamps disposed within the housing structure;
a first quartz window disposed within the housing structure between the process volume and the plurality of heating lamps; and
an injector apparatus coupled to the chamber body, comprising:
an injector body;
a first arcuate surface of the injector body, the first arcuate surface having a first outlet formed therein, the first outlet in fluid communication with a first conduit formed within the injector body;
a second arcuate surface of the injector body substantially parallel to the first arcuate surface and offset from the first arcuate surface, the second arcuate surface having a second outlet formed therein, the second outlet in fluid communication with a second conduit formed within the injector body;
a third surface of the injector body, the third surface having a third outlet formed therein, the third outlet in fluid communication with a third conduit formed within the injector body, wherein the third surface is substantially normal to the first arcuate surface and the second arcuate surface and the third outlet is substantially normal to the first outlet and the second outlet;
a first cooling channel formed in the injector body, the first cooling channel having:
a first portion of the first cooling channel disposed around a first side of the first conduit, wherein the first portion of the first cooling channel is adjacent the first arcuate surface; and a second portion of the first cooling channel disposed around a second side of the second conduit, wherein the second portion of the first cooling channel is adjacent the first arcuate surface and the second arcuate surface; and a second cooling channel formed in the injector body, the second cooling channel having:

a first portion of the second cooling channel disposed around a first side of the second conduit, wherein the first portion of the second conduit is adjacent the second arcuate surface; and a second portion of the second cooling channel disposed around a second side of the second conduit opposite the first side of the second conduit, wherein the second portion of the second cooling channel is adjacent the second arcuate surface.

10. The substrate processing apparatus of claim 9, wherein the first and second portions of the first cooling channel are in fluid communication with the first and second portions of the second cooling channel.

11. The substrate processing apparatus of claim 9, wherein a volume of the first and second portions of the first cooling channel is less than a volume of the first and second portions of the second cooling channel.

12. The substrate processing apparatus of claim 9, wherein the first arcuate surface is disposed radially inward of the second arcuate surface.

13. The substrate processing apparatus of claim 9, wherein the injector body comprises stainless steel or alloys thereof.

14. The substrate processing apparatus of claim 9, wherein the first conduit and the second conduit are electropolished and have a RMS surface roughness of less than about 0.5 microns.

15. The substrate processing apparatus of claim 9, wherein the third surface is a recessed surface disposed within an upper surface of the injector body.

16. A structure embodied in a machine readable medium used in a design process, the structure comprising:

an injector body;

a first arcuate surface of the injector body, the first arcuate surface having a first outlet formed therein, the first outlet in fluid communication with a first conduit formed within the injector body;

a second arcuate surface of the injector body substantially parallel to the first arcuate surface and offset from the first arcuate surface, the second arcuate surface having a second outlet formed therein, the second outlet in fluid communication with a second conduit formed within the injector body;

a third surface of the injector body, the third surface having a third outlet formed therein, the third outlet in fluid communication with a third conduit formed within the injector body, wherein the third surface is substantially normal to the first arcuate surface and the second arcuate surface and the third outlet is substantially normal to the first outlet and the second outlet;

a first cooling channel formed in the injector body, the first cooling channel having:

a first portion of the first cooling channel disposed around a first side of the first conduit, wherein the first portion of the first cooling channel is adjacent the first arcuate surface; and a second portion of the first cooling channel disposed around a second side of the second conduit, wherein the second portion of the first cooling channel is adjacent the first arcuate surface and the second arcuate surface; and a second cooling channel formed in the injector body, the second cooling channel having:

a first portion of the second cooling channel disposed around a first side of the second conduit, wherein the first portion of the second conduit is adjacent the second arcuate surface; and a second portion of the second cooling channel disposed around a second side of the second conduit opposite the first side of the second conduit, wherein the second portion of the second cooling channel is adjacent the second arcuate surface.

17. The structure of claim 16, wherein the structure resides on storage medium as a data format used for an exchange of layout data.

18. The structure of claim 16, wherein the structure includes at least one of test data files, characterization data, verification data, or design specifications.

19. The structure of claim 16, wherein the first and second portions of the first cooling channel are in fluid communication with the first and second portions of the second cooling channel.

20. The structure of claim 19, wherein a volume of the first and second portions of the first cooling channel is less than a volume of the first and second portions of the second cooling channel.

* * * * *